United States Patent
King et al.

(10) Patent No.: US 7,289,775 B1
(45) Date of Patent: Oct. 30, 2007

(54) METHOD FOR TRANSMIT POWER CONTROL

(75) Inventors: Eric J. King, Greensboro, NC (US);
Michael Benedict, Jamestown, NC (US)

(73) Assignee: RF Micro Devices, Inc., Greensboro, NC (US)

(*) Notice: Subject to any disclaimer, the term of this patent is extended or adjusted under 35 U.S.C. 154(b) by 583 days.

(21) Appl. No.: 10/382,827

(22) Filed: Mar. 6, 2003

(51) Int. Cl.
*H04Q 11/12* (2006.01)
*H04B 1/04* (2006.01)

(52) U.S. Cl. ............... 455/126; 455/83; 455/127.1; 455/115.1

(58) Field of Classification Search ............ 455/69, 455/522, 126, 517, 123, 127.1, 95, 102, 108, 455/572, 129, 127.2, 115.1, 115.2, 115.3, 455/115.4, 83, 78
See application file for complete search history.

(56) References Cited

U.S. PATENT DOCUMENTS

| | | | |
|---|---|---|---|
| 5,608,353 A | 3/1997 | Pratt | 330/295 |
| 5,629,648 A | 5/1997 | Pratt | 330/289 |
| 6,038,432 A * | 3/2000 | Onoda | 455/127.2 |
| 6,130,579 A | 10/2000 | Iyer et al. | 330/285 |
| 6,191,656 B1 | 2/2001 | Nadler | 330/288 |
| 6,229,395 B1 | 5/2001 | Kay | 330/252 |
| 6,236,840 B1 * | 5/2001 | Aihara et al. | 455/83 |
| 6,265,943 B1 | 7/2001 | Dening et al. | 330/296 |
| 6,271,727 B1 | 8/2001 | Schmukler | 330/284 |
| 6,285,239 B1 | 9/2001 | Iyer et al. | 327/531 |
| 6,307,364 B1 | 10/2001 | Augustine | 324/95 |
| 6,313,705 B1 | 11/2001 | Dening et al. | 330/276 |
| 6,329,809 B1 | 12/2001 | Dening et al. | 324/95 |
| 6,333,677 B1 | 12/2001 | Dening | 330/296 |
| 6,356,150 B1 | 3/2002 | Spears et al. | 330/145 |
| 6,369,656 B2 | 4/2002 | Dening et al. | 330/296 |
| 6,369,657 B2 | 4/2002 | Dening et al. | 330/296 |
| 6,392,487 B1 | 5/2002 | Alexanian | 330/254 |
| 6,404,287 B2 | 6/2002 | Dening et al. | 330/296 |
| 6,525,611 B1 | 2/2003 | Dening et al. | 330/298 |
| 6,528,983 B1 | 3/2003 | Augustine | 324/95 |
| 6,566,963 B1 | 5/2003 | Yan et al. | 330/311 |
| 6,795,712 B1 * | 9/2004 | Vakilian et al. | 455/522 |
| 6,801,784 B1 * | 10/2004 | Rozenblit et al. | 455/522 |
| 6,868,279 B2 * | 3/2005 | Sahlman et al. | 455/522 |
| 7,116,945 B2 * | 10/2006 | Moloudi et al. | 455/78 |
| 2004/0072597 A1 * | 4/2004 | Epperson et al. | 455/572 |
| 2004/0198257 A1 * | 10/2004 | Takano et al. | 455/127.1 |
| 2004/0248528 A1 * | 12/2004 | Rozenblit et al. | 455/126 |
| 2006/0028277 A1 * | 2/2006 | Yamashita et al. | 330/285 |

OTHER PUBLICATIONS

"802.11b Wireless LAN Solutions," RF Micro Devices, Inc., 2002.
"RF2948B 2.4 GHz Spread-Spectrum Transceiver," RF Micro Devices, Inc., Jun. 2002.
"RF5117 3V, 1.8 GHz to 2.8 GHz Linear Power Amplifier," RF Micro Devices, Inc., Sep. 2002.

* cited by examiner

*Primary Examiner*—Edward F. Urban
*Assistant Examiner*—John J. Lee
(74) *Attorney, Agent, or Firm*—Withrow & Terranova, PLLC

(57) ABSTRACT

A transceiver has power control circuitry integrated therein. In particular, the power control circuitry receives a signal indicative of the transmit power level and adjusts the gain on a variable gain amplifier within the transceiver such that the output of the transceiver is at a level from which the power amplifier will amplify the signal to the desired transmit power.

7 Claims, 5 Drawing Sheets ically, the present invention allows
METHOD FOR TRANSMIT POWER CONTROL

FIELD OF THE INVENTION

The present invention is related to controlling the output power of a transmitter and controlling power consumption associated with the transmitter at the same time.

BACKGROUND OF THE INVENTION

The Institute for Electrical and Electronics Engineers (IEEE) has sanctioned a wireless standard for Ethernet access known as 802.11. The most common application for this standard is in wireless modems, although certainly other transmitter applications do exist. In most typical applications, the transmitter includes an antenna and transceiver combination that transmits at a power level that varies as a function of the process and temperature. In most operating environments, this variation does not matter. However, in instances where the 802.11 transmitter is a wireless modem incorporated into a laptop computer, or is otherwise battery powered, power consumption becomes an issue. There are times when applying a power control algorithm to the device could result in lower power consumption and thus prolong battery life. The concept of power control being applied to 802.11 is not new, but has not been successfully deployed to date.

In the cellular phone industry, the concept of power control has seen a more robust development. Specifically, some standards, such as Code Division Multiple Access (CDMA), rely extensively on the fact that each transmitter in a cell may vary output power such that the system may operate with greater efficiency and lower interference.

To date, power control algorithms have been implemented in the integrated circuit (IC) dedicated to the baseband processor. The baseband processor IC is distinct from the transceiver IC and the power amplifier IC. To give the designer the most flexibility in circuit design, the three ICs must work in harmony. Many circuit designers do not like to be restricted to choosing ICs from a single vendor or manufacturer. As a result, for best power control options, ICs from multiple vendors must work in harmony. All too often, for competition reasons, the ICs from multiple vendors do not work well together. As a result, the designer may incorporate components external to the ICs onto the circuit board to facilitate cooperation between the different ICs. The use of external components takes up precious space on the circuit board, increases component counts, and otherwise increases costs associated with the transmitter.

Thus, there remains a need for a power control mechanism that allows transmitter designers to simplify board designs while simultaneously being well suited for IEEE 802.11.

SUMMARY OF THE INVENTION

The present invention is well suited for incorporation into the transmitter of a wireless modem that operates according to the IEEE 802.11 standard, although uses in other devices are also possible. Specifically, the present invention allows such a device to have the device's transmit power levels controlled so as to increase efficiencies through reduced current consumption. Likewise, the present invention simplifies circuit design for the circuit designers. The circuit design simplification is achieved by moving the power control circuitry from the integrated circuit for the baseband processor to the integrated circuit for the transceiver. Further, the present invention eliminates the need for power sense circuitry in the power amplifier of the transmitter. The placement of the power control circuitry in the transceiver and the elimination of the need for power sense circuitry in the power amplifier reduces the need for multiple components to work in harmony and reduces the need for extra components that previously helped integrated circuits work together.

The present invention is positioned in a transmitter of a wireless device. A baseband signal passes from a baseband integrated circuit chip to a transceiver integrated circuit chip for conversion to a radio frequency signal and pre-amplification. The radio frequency signal passes from the transceiver integrated circuit chip to a power amplifier which boosts the power level of the signal for transmission. The signal passes from the power amplifier to a transmit/receive switch and then to the antenna for transmission. The transmit/receive switch has some finite isolation between switches resulting in the transmitted signal leaking into the receiver, termed "leakage signal." This leakage signal is present at the receive input of the transceiver integrated circuit.

The transceiver integrated circuit takes the leakage signal present at the receive input and provides the leakage signal to the power control circuitry embedded in the integrated circuit chip of the transceiver. The power control circuitry analyzes the leakage signal and compares the transmitted power level embodied by the leakage signal to a desired transmit power level. The desired transmit power level may be provided by a local controller or by a remote base station. The power control circuitry then outputs a signal that controls a variable amplifier in the transmit path of the transceiver integrated circuit so as to control the signal that is presented to the input of the power amplifier. The determination of the control signal may be made through a look up table or the like based on the results of the comparison. The change in the amount of amplification at the variable amplifier in turn affects the power level at the output of the power amplifier and thus the power level that is present at the switch to create the leakage signal. This feedback loop enables the power level being transmitted from the antenna to be controlled by the transceiver integrated circuit rather than the baseband processor integrated circuit.

In an alternate embodiment, the power control circuitry produces a bias signal that is provided to a bias control input of the power amplifier. This further controls the power level at the output of the power amplifier. However, not every power amplifier has this bias control input, so this is an optional feature.

In a second alternate embodiment, the transceiver integrated circuit receives the transmitted power level from the power sense circuitry of the power amplifier. Because not every power amplifier includes the power sense circuitry and because not every manufacturer's power sense circuitry works the same, this is an optional feature.

Those skilled in the art will appreciate the scope of the present invention and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
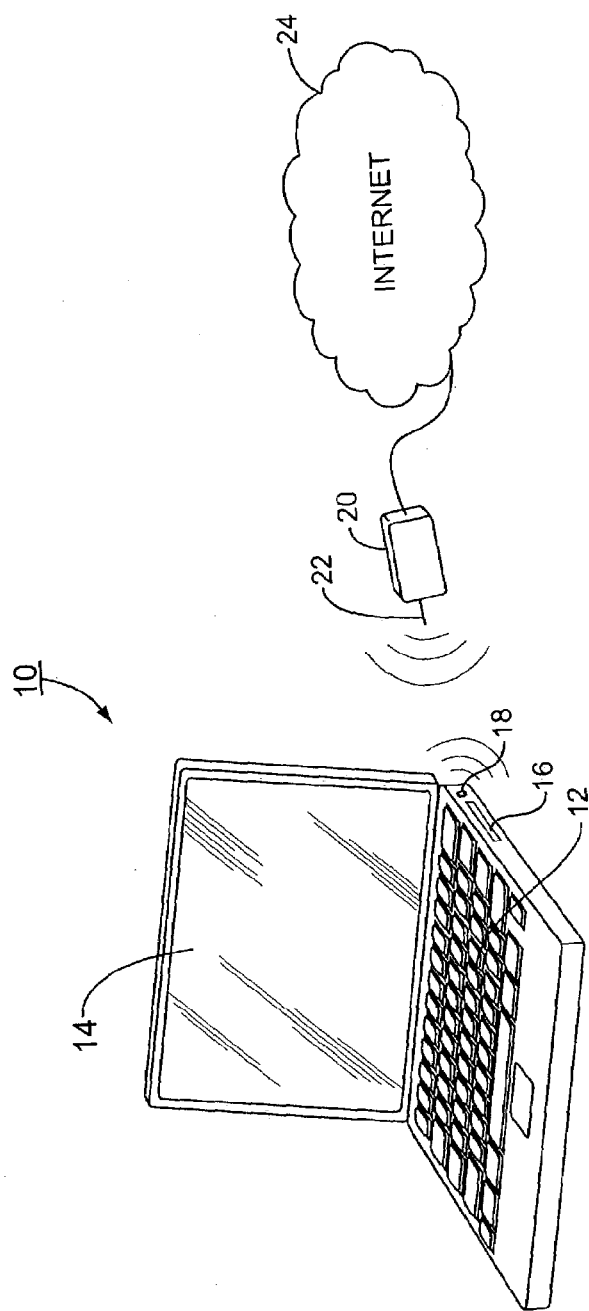
FIG. 1 illustrates a conventional laptop computer connected to the Internet via a 802.11 connection.

Laptop computers such as laptop 10 in FIG. 1 are becoming more prevalent with each passing day. Laptop 10 may have a keyboard 12, a display 14, a disk drive 16, and other input/output devices as is well understood. An exemplary laptop 10 may be the T23 THINKPAD sold by IBM. The T23 and other laptops include wireless modems that have antennas 18 that communicate wirelessly to a wirebased modem 20 through such standards as IEEE 802.11. The wirebased modem 20 may be a cable modem or the like and may incorporate a hub (not shown) with an antenna 22 that receives the wireless signals from the laptop 10. The wirebased modem 20 connects to the Internet 24 as is well understood. By providing the laptop 10 with the wireless modem and antenna 18, the designers allow users of the laptop 10 to improve the mobility and versatility of the laptop 10.

Figure 2:
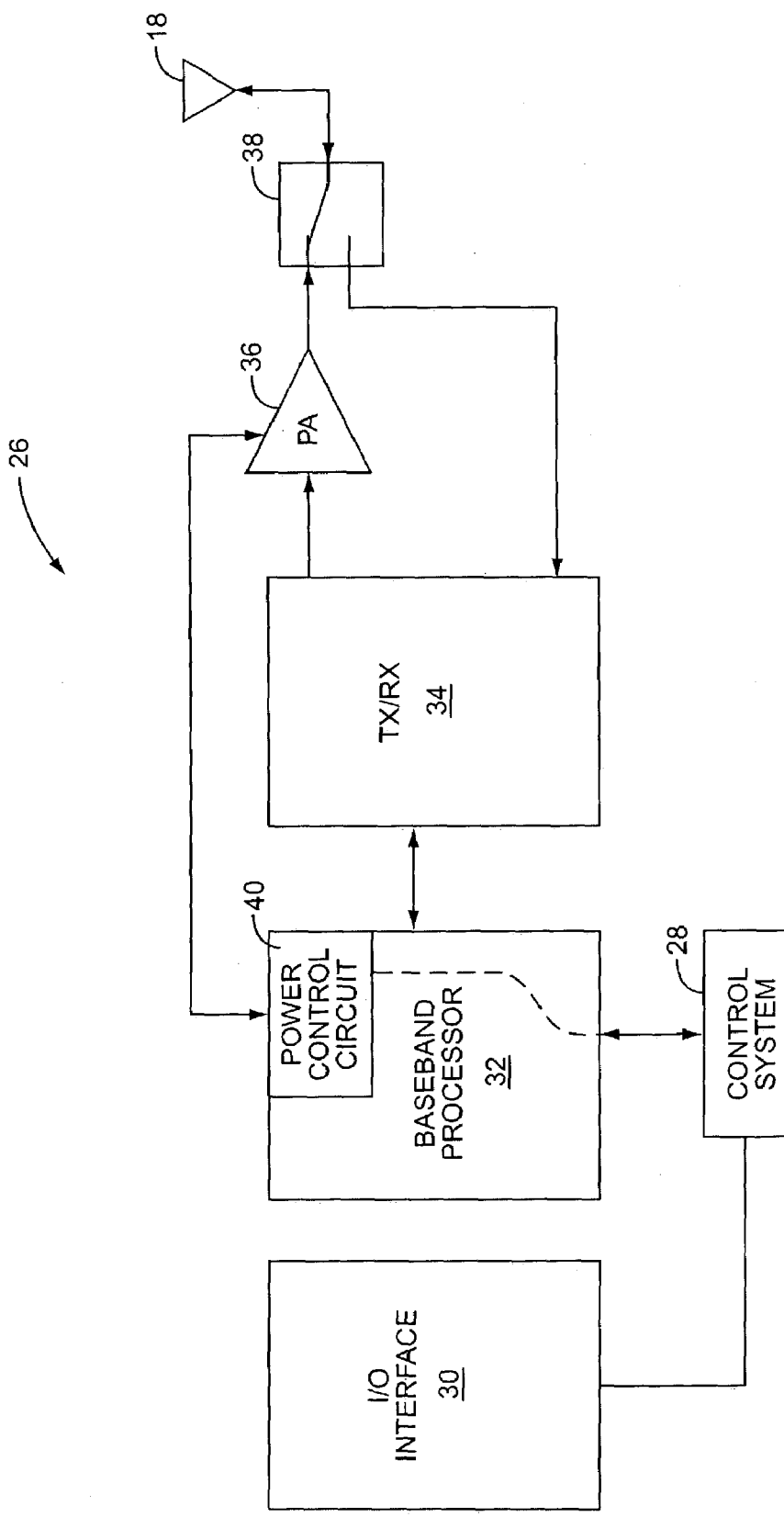
FIG. 2 illustrates a schematic diagram of a conventional transmitter associated with a wireless device.

The laptop 10 contains a transmitter 26 that culminates in antenna 18 as illustrated in FIG. 2. Laptop 10 also has a control system 28, which may be a microprocessor and associated operating system and the like as is well understood. Control system 28 is associated with an I/O interface 30 to receive inputs from a user and generate outputs for the user. For example, the I/O interface 30 may cooperate with the keyboard 12 and the display 14 as is well understood.

Transmitter 26 includes baseband processor integrated circuit 32, transceiver integrated circuit 34, power amplifier 36, switch 38, and the antenna 18. During operation, the laptop 10 may generate a signal to be transmitted. This signal may be an internet protocol (IP) packet, a voice signal, or the like. The signal is generated typically by the control system 28 which passes the signal to the baseband processor integrated circuit 32 for initial processing. This initial processing may encode the signal for transmission. The baseband processor integrated circuit 32 manipulates the signal at baseband frequencies and passes the signal to the transceiver integrated circuit 34. The transceiver integrated circuit 34 converts the signal to a radio frequency (RF) signal and may perform initial amplification. After frequency conversion, the signal is passed to the power amplifier 36 which boosts the power level of the signal to a desired level suitable for transmission. The boosted signal is passed through the switch 38 to the antenna 18 where the signal is transmitted to the antenna 22 of the wirebased modem 20 or other device.

It should be appreciated that the transmitter 26 may also share components with the receiver (not shown explicitly). Specifically, an incoming signal may be received by the antenna 18 and pass through the switch 38 to the transceiver integrated circuit 34. The transceiver integrated circuit 34 converts the incoming radio frequency signal to a baseband signal and passes the baseband signal to the baseband processor integrated circuit 32 for further processing.

In this typical arrangement of the transmitter 26, power control circuitry 40 is integrated into the baseband processor integrated circuit 32. The power control circuitry 40 controls the power level of the signal provided to the transceiver integrated circuit 34 and potentially controls a bias signal that is applied to the power amplifier 36. In return, the power amplifier 36 may send a power sensed signal to the baseband processor integrated circuit 32. The power sensed signal is standard on the RF 5117, sold by RF Micro Devices, Inc. of Greensboro, N.C., and generally understood in the art.

It should further be appreciated that the baseband processor integrated circuit 32 and the transceiver integrated circuit 34 are separate integrated circuit chips. As such, they may be positioned on the same circuit board, but are distinct entities within the laptop 10. It is also worth noting that the power control circuitry 40 may receive instructions on how to control the power from the control system 28. These instructions may be generated by the control system 28 or received from a remote location such as a cellular base station. For example, in a CDMA system, the base stations provide instructions to the cellular phones with precise power levels at which the cellular phones are to transmit. The instructions are embedded in the communications from the base station as is well understood in the industry.

The present invention takes a wireless device such as the transmitter 26 in the laptop 10, a cellular phone, a personal digital assistant with a wireless transmitter, or similar device operating according to IEEE 802.11, CDMA, or other communication protocol and provides a technique to provide power control thereto in such a manner that circuit design is simplified and power efficiencies are achieved. Collectively such devices are termed herein "mobile terminals." In the exemplary embodiment, the wireless device will continue to be a wireless modem in a laptop 10 operating according to IEEE 802.11, but the teachings of the present invention are not limited to this standard or such a device. Those of ordinary skill in the art will recognize that alternative devices and protocols may also benefit from the use of the present invention.

The present invention achieves design simplification and power control efficiencies by moving the power control circuitry 40 from the baseband processor integrated circuit 32 to the transceiver integrated circuit 34. This is illustrated schematically in FIG. 3. Specifically, a transceiver integrated circuit 34A contains, within the integrated circuit chip, transmit circuitry 42, receive circuitry 44, and power control circuitry 46. The transceiver integrated circuit 34A further includes outputs such as $RF_{OUT}$ 48 and PABIAS 50 as well as a receive input $RF_{IN}$ 52 and a baseband input $LF_{IN}$ 54. The inputs and outputs may be pins or contact pads as is conventional in the integrated circuit industry.

The input $LF_{IN}$ 54 receives the baseband signal from the baseband processor integrated circuit 32 and provides the signal to the transmit circuitry 42 for frequency conversion and amplification. The power control circuitry 46 controls how much amplification is provided to the signal. Once converted and amplified, the signal, depicted as signal 56, is output at $RF_{OUT}$ 48. Signal 58 may also be generated by the power circuitry 46 as a bias control signal and is output at the output PABIAS 50. The signal 56 and the signal 58 together are provided to the power amplifier 36. Note that signal 58 and the output PABIAS 50 of the transceiver integrated circuit 34A are optional features and need not be included for the present invention to work. A more detailed explanation of controlling the bias circuitry of a power amplifier to control current consumption can be found in commonly owned U.S. Pat. No. 6,333,677, which is hereby incorporated by reference.

Figure 3:
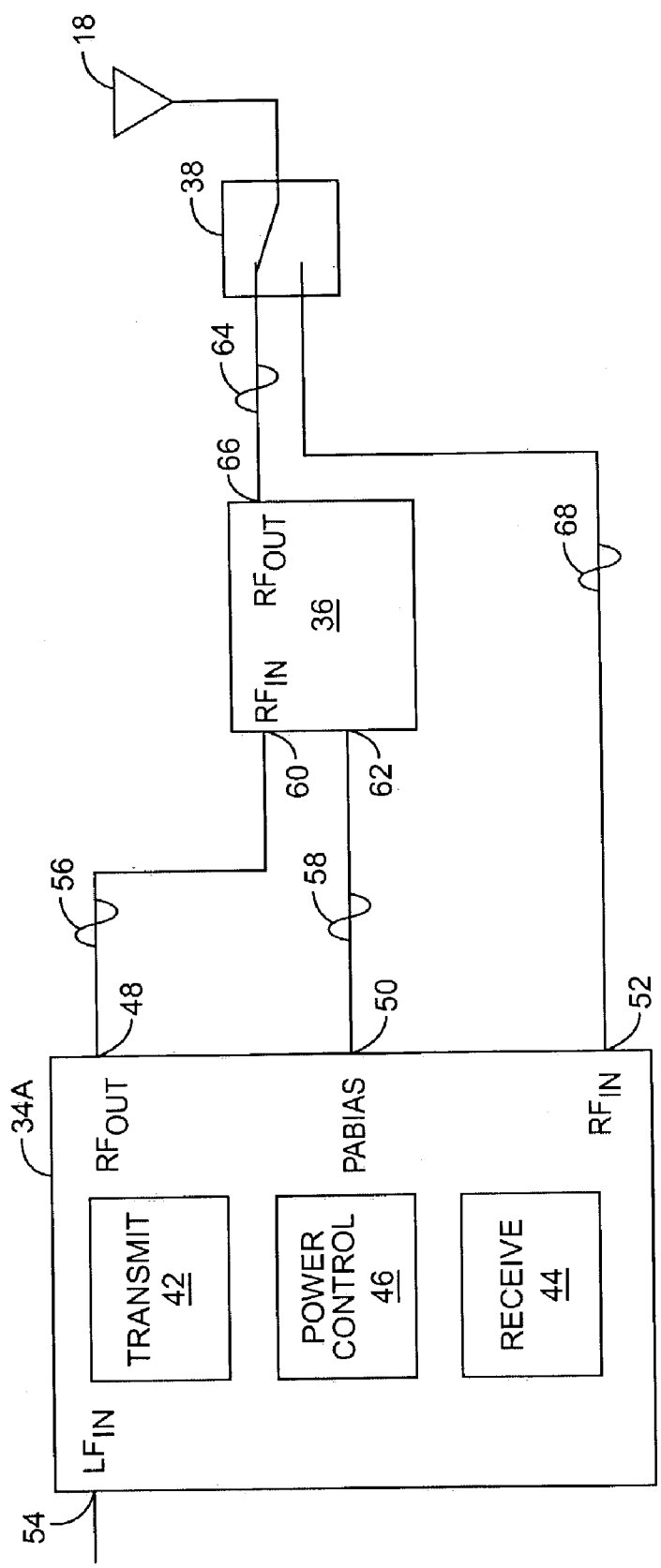
FIG. 3 illustrates a schematic drawing of one embodiment of the power amplifier and transceiver interrelation.

Signals 56 and 58 are presented to inputs 60 and 62, respectively, of the power amplifier 36. Input 60 receives an RF signal and thus is also labeled $RF_{IN}$ input 60. Input 62 receives a bias control signal and may not be present on every power amplifier 36. The power amplifier 36 amplifies the signal 56. The amplified signal, labeled 64 in FIG. 3, is output at $RF_{OUT}$ output 66. Signal 64 is passed to the switch 38 and then to the antenna 18. Some portion of the signal 64 leaks from the transmit path to the receive path in the switch 38 because there is limited isolation between the elements of the switch 38. This leakage is labeled leakage signal 68. Leakage signal 68 is thus an indication of the power level transmitted by the antenna 18. Leakage signal 68 may not exactly reflect the power level transmitted by the antenna 18 due to attenuation caused by the leaking at the switch 38 or other factors, but will be proportional to the transmitted power level.

The leakage signal 68 is made available to the $RF_{IN}$ input 52 on the transceiver integrated circuit 34A. Normally, signals that are present at $RF_{IN}$ input 52 would be presented to the receive circuitry 44, but when the transmitter is in the transmit mode, any signal present at $RF_{IN}$ input 52 is presented to the power control circuitry 46. This may be accomplished by a switch 70 (FIG. 4) within the transceiver integrated circuit 34A or other conventional signal routing technique.

Figure 4:
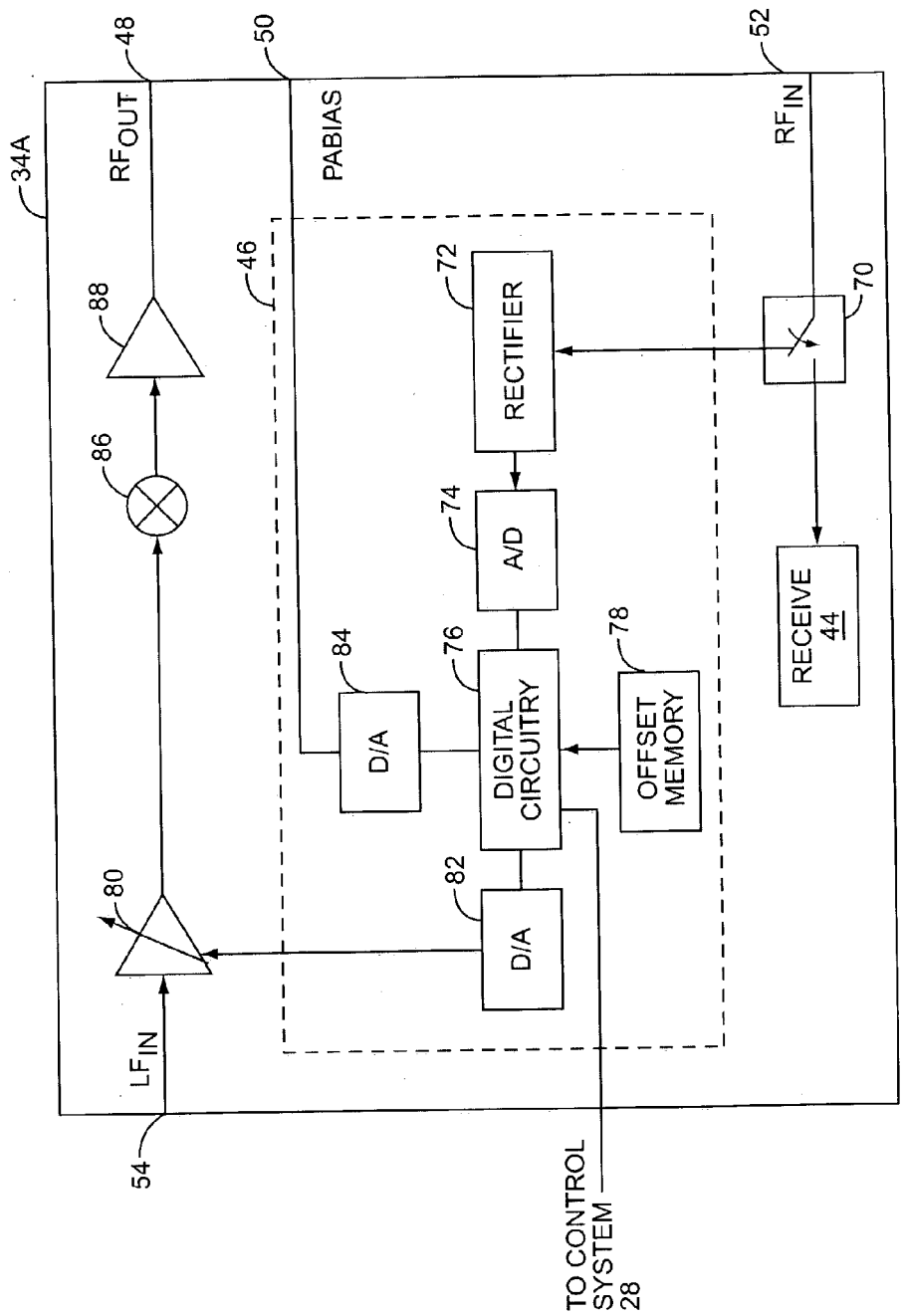
FIG. 4 illustrates a schematic drawing of an embodiment of the internal circuitry of the transceiver integrated circuit.

Greater details about the workings of the transceiver integrated circuit 34A are illustrated in FIG. 4. As noted above, a switch 70 or other signal routing device determines which way signals present at $RF_{IN}$ input 52 are routed. The switch 70 may direct a signal at $RF_{IN}$ input 52 to the receive circuitry 44 if the transmitter 26 is in the receive mode. The receive circuitry 44 downconverts the received signal to a lower frequency and digitizes the signal before passing the received signal to the baseband processor integrated circuit 32. The baseband processor integrated circuit 32 processes the digitized received signal to extract the information or data bits conveyed in the received signal. This processing typically comprises demodulation, decoding, and error correction operations.

Alternatively, and more importantly for the purposes of the present invention, the switch 70 may direct the leakage signal 68 to the power control circuitry 46. Within the power control circuitry 46, the leakage signal 68 is initially rectified by a rectifier 72. Note that a filter (not shown) may be used in conjunction with the rectifier if needed or desired. Other rectifying circuitry is usable, and the term "rectifier" is used herein to cover analogous circuits. The rectified signal is passed to an analog to digital (A/D) converter 74 for conversion to a digital signal. The digital signal is passed from the A/D converter 74 to digital circuitry 76. The digital circuitry 76 compares the signal from the A/D converter 74 to a predetermined desired power level. This predetermined desired power level may be generated by the control system 28 or from a base station or other location as is well understood. An offset may additionally be stored in an offset memory device 78. This offset may be applied to the desired signal level or the digitized version of leakage signal 68 as needed or desired. The offset may compensate for attenuation at the switch 38 or other factors that cause leakage signal 68 to be changed from the actual power level transmitted by the antenna 18.

Based on the comparison of the digitized leakage signal 68 and the desired transmit power level, as affected by the offset stored in offset memory device 78 (if any), one or more control signals may be generated. These control signals may be determined by reference to a look up table or the like based on the comparison. The primary control signal is designed to control the gain of a variable gain amplifier 80. The secondary control signal is optional and is the bias signal 58 (FIG. 3).

The primary control signal is directed to a digital to analog (D/A) converter 82 and then used to control the variable gain amplifier 80. The secondary control signal is also directed to a second D/A converter 84 before being output at PABIAS 50.

The signal that comes from the baseband processor integrated circuit 32 arrives at the input $LF_{IN}$ 54 (FIG. 3) and is directed to the variable gain amplifier 80, where the signal is amplified according to the settings of the variable gain amplifier 80. The amplified signal is then passed to an upconverting mixer 86 to modulate the signal onto a radio frequency (RF) signal as is well understood. The RF signal is then amplified again by a preamplifier 88 and output at $RF_{OUT}$ 48 as signal 56 (FIG. 3).

Note that the order of upconverting the mixer 86, the variable gain amplifier 80, and the preamplifier 88 may be rearranged without departing from the present invention.

By controlling the variable gain amplifier 80, the power control circuitry 46 controls the power level of the signal 56. By controlling the power level of the signal 56 before introduction into the power amplifier 36, the signal generated by the power amplifier 36 is controlled and thus the power level of the transmitted signal is controlled. This feedback loop effectively brings the transmitted power level to the desired transmit power level.

For power amplifiers 36 that have a bias signal input, such as the aforementioned RF 5117, the control may be further refined by using the bias signal 58. However, not every power amplifier 36 has a bias input, and thus, the use of the bias signal 58 is optional. Where there is a bias input on the power amplifier 36, current consumption may be reduced, prolonging battery life if needed or desired.

In an alternate embodiment, not illustrated, a signal indicative of the transmitted power may be provided directly by the power amplifier 36. For example, the RF 5117 has a power sense output pin that provides a signal indicative of the output power of the power amplifier 36. If this power sense signal is present, the power sense signal may be provided to the power control circuitry 46 without the need for rectification. However, not every power amplifier 36 has this sort of output, so such a technique for conveying the output power level transmitted is optional. Further, because not every manufacturer provides the same sort of power sense signal, it may be easier for the circuit designer to ignore the existence of such a signal and rely on the leakage signal 68. Reliance on the leakage signal 68 in fact eliminates the need for the power sense output from the power amplifier 36 and thus allows circuit designers to eliminate the power sense circuitry from the power amplifier 36 if needed or desired.

While the present invention is well suited to provide a feedback loop passing through the transceiver integrated circuit 34A rather than the baseband processor integrated circuit 32, an initial setting on the variable gain amplifier 80 must also be chosen to start the process. This is accomplished by using the look up table when the transceiver integrated circuit 34A switches from receive mode to transmit mode. At the time of the switch, the control system 28 sends a signal to the digital circuitry 76 with the desired output power level. The digital circuitry 76 uses the look up table to determine an appropriate setting for the variable gain amplifier 80 to achieve an output proximate the desired value. Specifically, the look up table may provide a value for a control signal. This control signal is sent to the variable gain amplifier 80 immediately prior to the arrival of the signal to be transmitted, and processing continues as indicated above.

The look up table may be derived from empirical testing or other calibration routine as needed or desired. Alternatively, the initial condition can be based on past measurements of the desired power and the last output gain setting that achieved that desired power. Thus, if the new desired power corresponds to the last used desired power, the table may have stored the setting that achieved that desired power.

Figure 5:
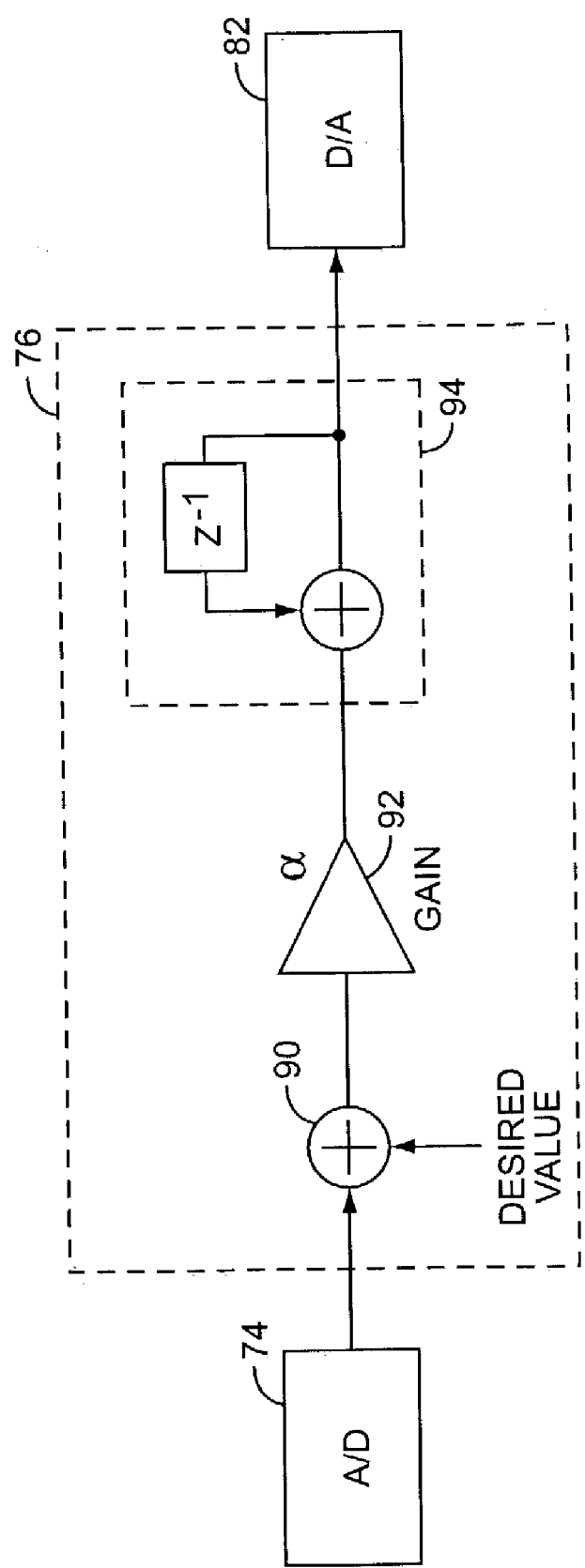
FIG. 5 illustrates a block diagram of a portion of the functions of the digital circuitry that may be used with the present invention.

FIG. 5 illustrates the internal workings of a portion of the digital circuitry 76. The output of the A/D converter 74 is subtracted from the desired value by an adder 90. The subtraction value tells the digital circuitry 76 how far the desired transmit power is removed from the actual transmit power. This value is sent through a gain block 92 to add or subtract to the current setting. Additionally, the output of the gain block 92 is sent through an integrator 94. It should be appreciated that there are many ways that this series of functions could be implemented, and the present invention is not restricted to a particular format thereof.

Those skilled in the art will recognize improvements and modifications to the preferred embodiments of the present invention. All such improvements and modifications are considered within the scope of the concepts disclosed herein and the claims that follow.

What is claimed is:

1. A method of controlling power transmitted from an antenna, comprising:
    sensing the power transmitted from the antenna, wherein sensing the power transmitted from the antenna comprises sensing a power level in a leakage signal from a switch;
    determining a desired level for the power transmitted from the antenna;
    comparing, in digital circuitry incorporated into a transceiver integrated circuit, the power transmitted from the antenna to the desired level;
    generating, in the digital circuitry, a control signal; and
    controlling a variable gain amplifier within the transceiver integrated circuit with the control signal, wherein the variable gain amplifier amplifies a transmit signal within the transceiver integrated circuit, such that the power transmitted from the antenna approaches the desired level.

2. The method of claim 1 wherein sensing the power transmitted from the antenna comprises rectifying a signal indicative of the power transmitted from the antenna to create an analog rectified signal.

3. The method of claim 1 wherein sensing the power transmitted from the antenna further comprises converting the analog rectified signal to a digital signal.

4. The method of claim 1 wherein generating, in the digital circuitry, a control signal comprises generating a digital control signal.

5. The method of claim 4 further comprising converting the digital control signal to an analog signal to control the variable gain amplifier within the transceiver integrated circuit.

6. The method of claim 1 further comprising generating, in the digital circuitry, a bias signal to control a bias level of a power amplifier.

7. The method of claim 1 comprising forwarding the transmit signal to a power amplifier associated with the antenna, wherein the power amplifier is distinct from the transceiver integrated circuit.

* * * * *